United States Patent
Germain et al.

(10) Patent No.: US 7,547,928 B2
(45) Date of Patent: Jun. 16, 2009

(54) ALGAN/GAN HIGH ELECTRON MOBILITY TRANSISTOR DEVICES

(75) Inventors: Marianne Germain, Liège 1 (BE); Joff Derluyn, Brussels (BE); Maarten Leys, Eindhoven (NL)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 442 days.

(21) Appl. No.: 11/174,343

(22) Filed: Jun. 29, 2005

(65) Prior Publication Data

US 2006/0006414 A1   Jan. 12, 2006

Related U.S. Application Data

(60) Provisional application No. 60/584,687, filed on Jun. 30, 2004.

(30) Foreign Application Priority Data

Nov. 30, 2004   (EP) ................................. 04447267

(51) Int. Cl.
  *H01L 29/778*   (2006.01)
  *H01L 21/335*   (2006.01)
(52) U.S. Cl. .................. 257/194; 257/12; 257/200; 257/201; 257/E29.246; 257/E29.247; 257/E21.403; 257/E21.407
(58) Field of Classification Search .............. 438/637, 438/638; 257/E21.579, 12, 194, 200, 201, 257/E29.246, E29.247, E21.403, E21.407
See application file for complete search history.

(56) References Cited

U.S. PATENT DOCUMENTS

| 5,192,987 | A | 3/1993 | Khan et al. |
| 5,445,979 | A | 8/1995 | Hirano |
| 2002/0096692 | A1* | 7/2002 | Nakamura et al. ........... 257/194 |
| 2002/0167023 | A1 | 11/2002 | Chavarkar et al. |
| 2003/0020092 | A1 | 1/2003 | Parikh et al. |
| 2005/0173728 | A1* | 8/2005 | Saxler ......................... 257/192 |

FOREIGN PATENT DOCUMENTS

| JP | 2003 115487 A | 4/2003 |
| WO | WO 01/13436 | 2/2001 |

OTHER PUBLICATIONS

Search report dated Nov. 19, 2007 for equivalent European Patent No. 05447155.2-2203 filed Jun. 29, 2005.

* cited by examiner

*Primary Examiner*—Michelle Estrada
(74) *Attorney, Agent, or Firm*—Knobbe Martens Olson & Bear LLP

(57) ABSTRACT

The present invention recites a new method for manufacturing Group III-N field-effect devices, such as HEMT, MOSHFET, MISHFET devices or MESFET devices, grown by Metal-Organic Vapor Phase Expitaxy, with higher performance (power), by covering the surface with a thin SiN layer on the top AlGaN layer, in the reactor where the growth takes place at high temperature, prior cooling down the structure and loading the sample out of the reactor, as well as a method to produce some HEMT transistors on those heterostructures, by depositing the contact on the surface without any removal of the SiN layer by MOCVD. The present invention recites also a device.

14 Claims, 10 Drawing Sheets

ALGAN/GAN HIGH ELECTRON MOBILITY TRANSISTOR DEVICES

CROSS-REFERENCE TO RELATED APPLICATIONS

This application claims priority under 35 U.S.C. § 119(e) to U.S. Provisional Application No. 60/584,687, filed Jun. 30, 2004. The above-referenced prior application is incorporated by reference herein in its entirety and is hereby made a portion of this specification.

FIELD OF THE INVENTION

The invention relates to the group III-nitride field effect devices, and methods to improve stability of the surface, by passivation of the top surface, as well as to ohmic contact deposition on wide bandgap layers.

BACKGROUND OF THE INVENTION

High Electron Mobility Transistors (HEMTs) were first developed in the 1970's and are employed in advanced communications applications, such as microwave circuit applications. The first HEMTs were formed using GaAs and AlGaAs, but new structures using GaN and other materials are becoming of greater importance. The HEMT behaves much like a conventional Field Effect Transistor (FET), and the fabrication of HEMT devices is based on FET architecture. However, HEMTs require a very precise, lattice-matched heterojunction between two compound semiconductor layers.

GaN Field-effect devices are piezoelectric devices, i.e., the presence of spontaneous and piezoelectric polarizations are responsible for charge separation within the material. This has the enormous advantage in that it allows, at the interfaces between different material compositions, e.g. AlGaN and GaN, the creation of surface charged layers in the structures. Those surface charged layers are compensated in the AlGaN/GaN junction by the formation of two-dimensional electron gas (2DEG) at the other side of the interface, which has high mobility values compared to the bulk material. While necessary and beneficial for the creation of a very high mobility channel in the structure, allowing for operation of high power HEMT devices, it has the drawback in that the separation charges within a wurtzite material are also responsible for the surface charged layer at the top surface of the structure, leading to an increased importance of surface states, compared to zincblend structure materials. The presence of surface states creates acute problems for achieving the high performance that is theoretically predicted for those devices, as surface states play an important role during device operation. It has been noted by many authors that the reduction of DC performance, current slump at high drain-source voltages, and DC to RF dispersion phenomena are directly related to the filling and emptying of surface states, although thermal effects are also partially responsible for DC current slump.

To minimize the effect of such surface states on the top III-N structures, passivation of the surface between drain and source by, e.g., SiN or $SiO_2$, has been proposed by different authors, using essentially ex-situ methods during the processing of the transistors. These methods are very dependent on the growth conditions of the oxide or insulating layer on the top surface, as strain effects, tuned by growth conditions and also dependent on the strain state in the heterostructure itself, also have a influence on the two-dimensional electron gas properties. They are also dependent on the chemical or mechanical state of the surface, which is dependent on the previous processing steps that have occurred on this top surface.

US 2003/0020092 A1 describes an AlGaN/GaN HEMT having a thin AlGaN layer. Source and drain contacts contact the AlGaN layer, while parts of the AlGaN layer are uncovered by the contacts. An insulating layer covers the uncovered part of the AlGaN layer and a gate contact is included on the insulating layer. In an embodiment, the HEMT and the insulating layer are fabricated using metal-organic chemical vapor deposition. In another embodiment, the insulating layer is sputtered onto the top surface of the HEMT active layers.

WO 01/13436 A1 describes a GaN based FET that employs dielectric passivation layers on exposed AlGaN or GaN surfaces of the devices above the channel regions, between the source and drain contacts. The dielectric layer is formed of SiN. The layer controls undesirable frequency-dependent current and reduced breakdown voltage.

U.S. Pat. No. 5,192,987 discloses a high electron mobility transistor. The transistor consists of a GaN/AlGaN heterojunction where a two-dimensional electron gas occurs. The structures are deposited on basal plane sapphire using low-pressure metal organic chemical vapor deposition.

Another problem in the development of field-effect GaN based transistors is the ohmic contact formation on the group III-nitride surface. The ohmic contact formation is dependent on different factors, e.g., the surface composition, but one very important factor, which has long been underestimated, is the degree of oxidation of the top surface. Different cleaning techniques and metallization techniques have been suggested to overcome this problem. The lack of a good ohmic contact formation on the top layer directly leads to drastic reduction of the device performance. It is very often observed that the maximum current which is measured, under DC conditions, is well below the maximum current density values deduced from material considerations such as carrier density and mobility in the channel.

Furthermore, the uniformity and reproducibility of the device performances over a wafer and from one wafer to another is often a problem. Even if record performance has been demonstrated on selected HEMT devices, uniformity and reproducibility of the results remain problematic. Although improvement of material quality and device processing is believed to allow for better results in uniformity and reproducibility, a fundamental problem to be overcome is the accurate control of the surface properties.

Finally, another problem frequently encountered with piezoelectric devices such as AlGaN/GaN HEMT devices is encountered. In order to increase the current density in the two-dimensional electron gas, there exist two possibilities: either increase the AlGaN layer thickness, or increase the Al content in this top surface. These two possibilities, by increasing the strain in the top AlGaN, which is grown pseudomorphically on the GaN layer, an increased carrier density in the channel can be obtained. However, the presence of high strain in the AlGaN layer rapidly leads to cracking of this top surface. Those cracks in the AlGaN are very prejudicial—they destroy the 2DEG at the AlGaN/GaN interface; second, they complicate processing.

SUMMARY OF THE INVENTION

It is desirable to prevent crack appearance in the top AlGaN layer, even for highly strained layers. It is important to note that most of these cracks are believed to occur during the cooling down of the structure. An effective way of reducing cracks appearance in III-N devices is even more desirable when growing these III-N devices on Si substrates, as differences in thermal expansion coefficients are even larger than with SiC or sapphire substrates.

It is an aim of the preferred embodiments to stabilize the surface of the GaN field-effect devices prior surface contamination by air exposure and any damaging through different processing steps, in order to have an increased electron density in the channel and a high performance device, as well as a reliable process. It is a further aim to have a reduced ohmic contact resistance. It is a further aim of the preferred embodiments to increase the two-dimensional electron gas, by reducing the strain-induced modification during cooling down, by allowing for higher strain in the heterostructure without damaging the mechanical properties of the top surface and thus directly increase the HEMT performance In a first aspect, a device is provided, the device comprising a substrate, a first active layer, a second active layer on the first active layer, the second active layer having a higher bandgap than the first active layer, a two-dimensional electron gas layer between the first active layer and the second active layer, a passivation layer on the second active layer, and a source contact and a drain contact, the source contact and the drain contact contacting the passivation layer.

In an embodiment of the first aspect, the passivation layer can be arranged such that the electron density in the two-dimensional electron-gas layer is increased.

In an embodiment of the first aspect, the gate contact is preferably in electrical contact with the second active layer.

In an embodiment of the first aspect, the first active layer is preferably formed of a group III nitride semiconductor material, more particularly of GaN.

In an embodiment of the first aspect, the second active layer is preferably formed of a group III nitride semiconductor material, more particularly of AlGaN or AlGaInN.

In an embodiment of the first aspect, a spacer layer can be positioned between the first active layer and the second active layer.

In an embodiment of the first aspect, a third layer, preferably formed of a group III nitride material, can be positioned between the second active layer and the passivation layer.

More particularly, in an embodiment of the first aspect, the passivation layer can be arranged such that it reduces or eliminates the effect of surface states on the carrier density in the two-dimensional electron gas, during device operation.

In an embodiment of the first aspect, the passivation layer is preferably formed of a material comprising at least an electron donating element and nitrogen, more particularly is formed of silicon nitride.

In an embodiment of the first aspect, the passivation layer can be a multi-layered structure comprising a group III nitride material and a material selected from the group consisting of SiN or AlN.

In an embodiment of the first aspect, the thickness of the passivation layer is preferably between 1 nm and 30 nm.

In an embodiment of the first aspect, the substrate is preferably formed of a material selected from the group consisting of silicon, sapphire, SiC, GaN and AlN.

In an embodiment of the first aspect, the source contact and the drain contact are deposited on the passivation layer.

In an embodiment of the first aspect, a device as recited in the previous embodiments is disclosed further comprising a gate contact in electrical contact with the second active layer.

In another embodiment, a part of the passivation layer is being uncovered by the source contact and the drain contacts. The gate contact can contact the passivation layer or the gate contact can be deposited on the second active layer.

In another embodiment, a device as recited in any of the previous embodiments is disclosed wherein the first active layer is formed of a group III nitride semiconductor material.

In a preferred embodiment, the first active layer is formed of GaN.

In another embodiment, the second active layer is formed of a group III nitride material.

In a preferred embodiment, the second active layer is formed of AlGaN or AlGaInN.

Between the first active layer and the second active layer (also called the interface), surface charged layers can be created in the device. The surface charged layers are compensated by the formation of two-dimensional electron gas at the other side of the interface, resulting in high mobility values compared to the bulk material. This is beneficial for the creation of a very high mobility channel in the device.

In another embodiment, a spacer layer is present between the first active layer and the second active layer. The spacer layer is selected such that the mobility at the interface is increased. The spacer layer can be formed of, but is not limited hereto, AlN.

In another embodiment, the second active layer is partly or entirely doped with donor elements such as Si, to provide another source of electrons.

In another embodiment, the second active layer is covered by a third layer, the third layer being formed of a Group III nitride material such as, but not limited hereto, GaN. The third layer is between the second active layer and the passivation layer.

In another embodiment, the device can further comprise at least one buffer layer between the substrate and the first active layer. The buffer layer provides an appropriate crystal structure transition between the substrate and the remainder of the device. The buffer layer can be a nucleation layer between the substrate and the first active layer. In a particular embodiment, the buffer layer can include, but is not limited hereto, AlN, GaN or AlGaN.

In an embodiment, the passivation is arranged such that it reduces or eliminates the effect of surface states on the carrier density in the two-dimensional electron gas, during device operation.

In an embodiment, a device as recited in any of the previous embodiments is disclosed wherein the passivation layer comprises at least a donor material and nitrogen.

In a particular embodiment, the passivation layer is formed of silicon nitride.

In another embodiment, the passivation layer is formed of magnesium nitride.

In a further embodiment, the passivation layer is a multi-layered structure comprising a group III nitride material and a SiN or AlN.

The passivation layer is arranged such that it reduces the effect of surface states on the carrier density in the two-dimensional electron gas, during device operation.

Although the preferred embodiments are not limited to this, a possible explanation of such an effect is that the SiN layer provides a charge neutral interface with the AlGaN, eliminating surface depletion of the 2DEG. The presence of high level of Si or at least donor-type of defects in the passivation layer can be beneficial for the compensation of surface charge effects. Presence of surface states creates accuracy problems for achieving the high performance, as surface states play an important role during device operation.

The thickness of the passivation layer is preferably from about 1 nm to about 100 nm, more preferably from about 1 nm to about 50 nm, even more preferably from about 1 nm to about 30 nm, and still more preferably from about 1 nm to about 20 nm. Preferably, the thickness is from about 1 nm to about 30 nm.

The passivation layer is characterized by an amorphous structure.

Furthermore, a thin passivation layer allows the formation of ohmic contacts with a low resistance.

Furthermore, the passivation layer comprises Si, and the Si can diffuse in the AlGaN, where it acts as a donor.

The introduction of a donor type in the AlGaN layer facilitates ohmic contact formation, thereby reducing the contact resistance.

The first active layer, the second active layer, and the passivation layer are formed in the same reactor without exposing the layers to air.

Preferably, the passivation layer is formed by MOVPE (Metal-Organic Vapor Phase Epitaxy) or MBE (Molecular Beam Epitaxy).

The passivation layer is formed at a temperature preferably from about 700° C. to about 1300° C., more preferably from about 700° C. to about 1250° C., and even preferably from about 700° C. to about 1100° C.

In a further embodiment, the second active layer is not covered with an oxide layer. The passivation layer is in direct contact with the second active layer.

In a further embodiment, a device as recited in any of the previous embodiments is disclosed wherein the substrate is formed of a material selected from the group consisting of silicon, sapphire, SiC, GaN, and AlN.

In another embodiment, the device as recited in any of the previous embodiments is a field-effect transistor. The field-effect transistor can be, but is not limited to, a HEMT (High Electron Mobility Transistor), MOSHFET (Metal Oxide Semiconductor Heterostructure Field Effect Transistors), MESFET (Metal Semiconductor Field Effect Transistor), MISFET (Metal-Insulator-Semiconductor Field Effect Transistor), or MISHFET (Metal-Insulator-Semiconductor Heterostructure Field Effect Transistor).

In a further embodiment, a device as in any of the previous embodiments is provided wherein the device is characterized by a higher current density and a higher power performance compared to prior art devices.

In another preferred embodiment, the source contact and drain contact are made of an alloy comprising Ti, Al, Ni, Mo, Ta, Pt, Pd, V, Nb, Zr, and/or Au. The contact is preferably formed by a sequence of Ti/Al/Ti/Au, Ti/Al/Ni/Au, Ti/Al/Mo/Au, or Ti/Al/Pt/Au.

It is probable that when one of the layers is made of Al, the latter easily forms an alloy with nitrogen, AlN, and that silicon acts as a dopant in the AlGaN layer. This facilitates the ohmic contact formation.

In a second aspect, a method for forming a device is provided, the method comprising the steps of: placing a substrate in a reaction chamber; forming a first active layer on the substrate; forming a second active layer on the first active layer, the second active layer having a higher bandgap than the first active layer, thereby forming a two-dimensional electron gas layer between the first active layer and the second active layer; forming a passivation layer on the second active layer; and forming a source contact and a drain contact, the source contact and the drain contact contacting the passivation layer, with part of the passivation layer being uncovered by the source contact and the drain contact.

In an embodiment of the second aspect, the method further comprises the step of forming a gate contact in electrical contact with the second active layer.

In an embodiment of the second aspect, the steps of forming a first active layer, forming a second active layer, and forming a passivation layer are performed in a reactor chamber without subjecting the device to the air (environment).

More particularly, in an embodiment of the second aspect, the reaction chamber can be a MOVPE (Metal Organic Vapor Phase Epitaxy) reaction chamber.

In an embodiment of the second aspect, the method can further comprise the steps of: cooling the reaction chamber; removing the device with its deposited layers from the reaction chamber; the cooling step and the removing step being performed after the step of forming a passivation layer and before the step of forming a source and drain contact.

In an embodiment of the second aspect, the step of forming the passivation layer is preferably performed at a temperature of from about 700° C. to about 1300° C.

In an embodiment of the second aspect, the steps of forming a source contact and drain contact are performed such that there is a direct contact between the passivation layer and the source contact and the drain contact.

In an embodiment of the second aspect, the first active layer is preferably formed of a group III nitride semiconductor material, more particularly of GaN.

In an embodiment of the second aspect, the second active layer is preferably formed of a group III nitride semiconductor material, more preferably of AlGaN or AlGaInN.

In an embodiment of the second aspect, the passivation layer preferably comprises an electron donating element and nitrogen, more preferably the passivation layer is made of SiN.

In an embodiment of the second aspect, a method as recited in any of the previous embodiments is disclosed further comprising the step of forming a gate contact in electrical contact with the second active layer. The gate contact is formed on the uncovered part of the passivation layer.

In an embodiment of the second aspect, the steps of forming a first active layer, forming a second active layer, and forming a passivation layer are performed in a reactor chamber without exposing the device to the air ("in situ" formation).

In a preferred embodiment, the reaction chamber is a MOVPE reaction chamber.

The formation of an oxide on the second active layer is substantially avoided. Moreover, the step of removing the oxide layer from the top surface of the second active layer is avoided. This results in an improved ohmic contact formation.

The prior art shows that the oxide which spontaneously forms over the top surface of the second active layer is very stable, and thus requires high power and/or high duration of plasma etching prior to effectively eliminating the oxide layer.

In an embodiment of the second aspect, the method can further comprise the step of forming at least one buffer layer between the substrate and the first active layer. This step is performed after the step of placing the substrate in the reaction chamber. The buffer layer provides an appropriate crystal structure transition between the substrate and the remainder of the device. The buffer layer can be a nucleation layer between the substrate and the first active layer.

In a preferred embodiment, the buffer layer can consist of, but is not limited hereto, AlN, GaN, AlGaN or InN or combinations thereof.

In a preferred embodiment, the buffer layer is formed at a growth temperature which is lower than the growth temperature of the first active layer.

In an embodiment of the second aspect, the method further comprises the step of: cooling the reaction chamber; and removing the device with its deposited layer from the reaction chamber; the steps being performed after the step of forming a passivation layer and before the step of forming a source and drain contact.

In an embodiment of the second aspect, the step of forming the passivation layer is performed at a temperature preferably from about 700° C. to about 1300° C., more preferably from about 700° C. to about 1250° C., and even more preferably from about 700° C. to about 700° C. and 1100° C.

When the passivation layer is deposited at a temperature of at least about 700° C. on top of the second active layer, preferably AlGaN, this results in a reduction of the cracks in the second active layer. Cracks occur when cooling down the device from growth temperature to room temperature. Therefore, it permits increasing either the thickness of the second active layer, and/or the Al content in the second active layer. This results in an increase of the carrier density in the channel.

The step of forming a source contact and drain contact are performed such that there is a direct contact between the passivation layer and the source contact and the drain contact. This means that the passivation layer is not etched before formation of the source and drain contacts.

When "SiN" is referred to herein, a compound consisting of Si and N is meant. SiN can include $Si_3N_4$, but also other formulas are included, including, but not limited to, $Si_xN_y$, in different stoichiometric and non-stoichiometric ratios.

In the formula $Si_xN_y$, x and y are defined as real numbers, with $0<x\leq100$ and $0<y\leq100$.

In an embodiment of the second aspect, the step of forming a first active layer comprises flowing source gasses adapted for the formation of the first active layer into a reactor chamber. The step of forming a second active layer comprises flowing source gases adapted for the formation of the second active layer into the reaction chamber. The step of forming the passivation layer comprises flowing source gasses adapted for the formation of the passivation layer into a reactor chamber.

In a further embodiment, the first active layer is formed of a group III nitride semiconductor material. In a preferred embodiment, the first active layer is formed of GaN. In another further embodiment, the second active layer is formed of a group III nitride material. In a preferred embodiment, the second active layer is formed of AlGaN.

In another further embodiment, the passivation layer is formed of silicon nitride.

The characteristics of the different layers formed by the method of the second aspect are similar to those described for the first aspect.

DETAILED DESCRIPTION OF THE PREFERRED EMBODIMENT

Figure 1:
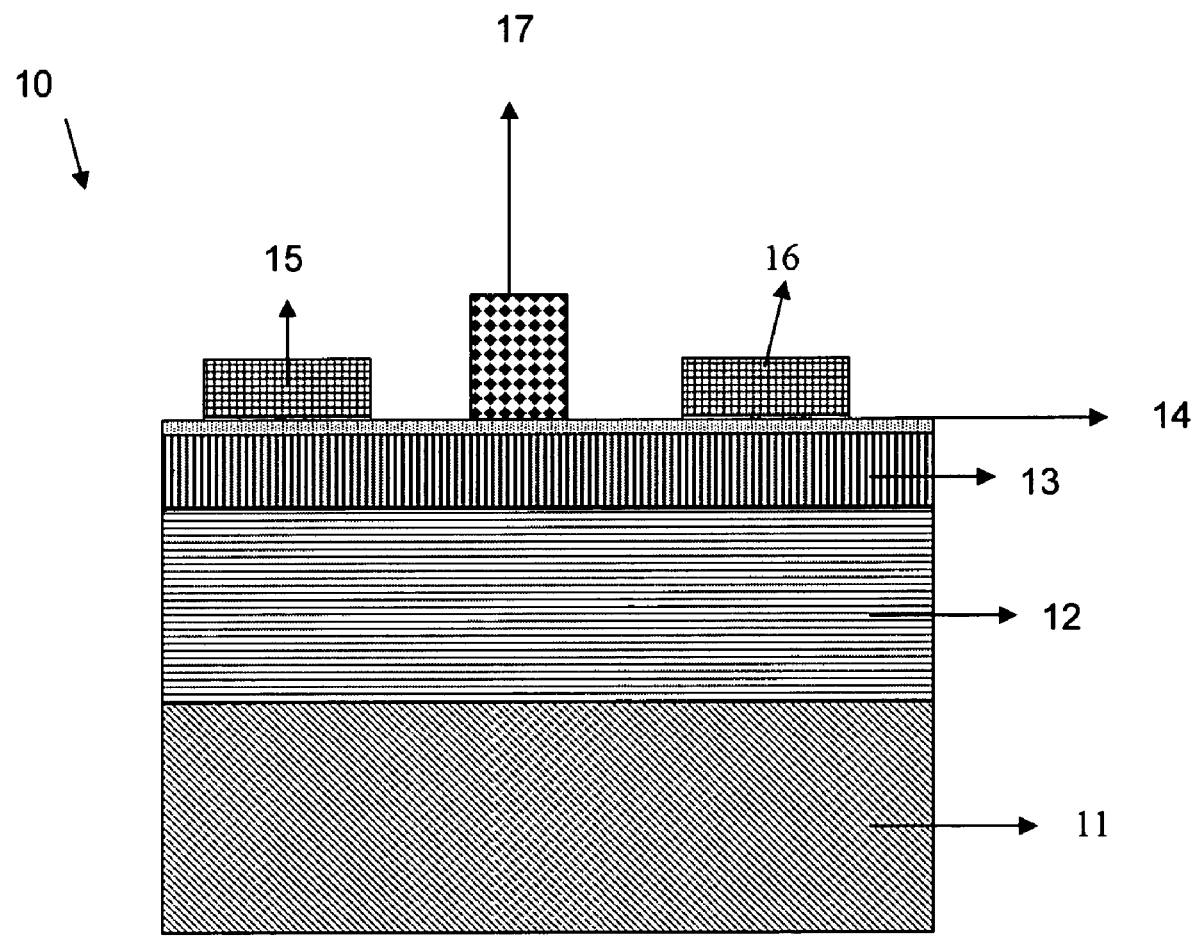
FIG. 1 represents a HEMT device in accordance with a preferred embodiment.

The following description, drawings, and examples illustrate a preferred embodiment of the present invention in detail. The drawings described are only schematic and are non-limiting. In the drawings, the size of some of the elements may be exaggerated and not drawn on scale for illustrative purposes. Those of skill in the art will recognize that there are numerous variations and modifications of this invention that are encompassed by its scope. Accordingly, the description of a preferred embodiment should not be deemed to limit the scope of the present invention.

The preferred embodiments provide a device and method that overcomes the problems related to surface stability and homogeneity, as well as a better control of the ohmic contact formation.

The preferred embodiments are based on the surprising discovery that the ohmic contacts (source and drain contacts) are not hindered (and to the contrary are improved) by the presence (immediately underneath) of a SiN layer.

A semiconductor device is provided comprising: a substrate, a first active layer, a second active layer (on the first active layer), the second active layer having a higher bandgap than the first active layer, a two-dimensional electron gas layer between the first active layer and the second active layer, a passivation layer (on the second active layer) consisting of an electron donating element and nitrogen, and a source contact and a drain contact directly deposited on the passivation layer.

In the context of the preferred embodiments, except if specified otherwise, the term "on" when referring to the relative position of two layers, means "directly or immediately on" (i.e., without an intermediary layer) or can also mean "above, with one or more intermediary layers".

In particular, in a semiconductor device of a preferred embodiment or in a method of a preferred embodiment, the source and drain contacts are (deposited) directly on the passivation layer, i.e., there is no intermediary layer (neither between the source contact (or source electrode) and the passivation layer nor between the drain contact (or drain electrode) and the passivation layer).

In a semiconductor device according to the preferred embodiments, the electron donating element can be B, Se, C, or Ge, but is preferably Si.

It is believed that the electron donating element (in particular Si) diffuses in the second active layer and acts there as a donor; and the introduction of a donor type in the second active layer facilitates the ohmic contact formation reducing thereby the contact resistance.

It is also believed that when one of the layers is made of Al, the latter easily forms an alloy with nitrogen, AlN, and that the electron donating element (in particular Si) acts as a dopant in the AlGaN layer. This facilitates the ohmic contact formation.

In a semiconductor device according to the preferred embodiments, the passivation layer can comprise (or consist of) CN, BN, GeN, or SiN. Preferably, the passivation layer comprises (or consists of) BN or SiN. And more preferably, the passivation layer comprises (or consists of) SiN.

Preferably, the passivation layer has a thickness of from about 1 nm to about 30 nm.

Preferably, the first active layer comprises (or consists of) a group III nitride semiconductor material, more particularly comprises (or consists of) GaN.

Preferably, the second active layer comprises (or consists of) a group III nitride semiconductor material, more particularly comprises (or consists of) AlGa or AlGaInN.

A semiconductor device of the preferred embodiments can further comprise a gate contact in electrical contact with the second active layer.

A semiconductor device of the preferred embodiments can further comprise a spacer layer between the first active layer and the second active layer. The spacer layer aims at increasing the mobility in the 2DEG layer. For example, the spacer layer can comprise (or consists of) AlN.

A semiconductor device of the preferred embodiments can further comprise a third layer between the second active layer and the passivation layer. The third layer aims more particularly at providing electrons to the channel. Preferably, the third layer comprises (or consists of) a group III nitride material.

In a semiconductor device according to the preferred embodiments, the substrate can comprise (or consist of) a material selected from the group consisting of silicon, sapphire, SiC, GaN, and AlN.

The present preferred embodiments also provide a method for fabricating a semiconductor device comprising the steps of: placing a substrate in a reaction chamber, depositing on the substrate a first active layer, depositing on the first active layer a second active layer having a higher bandgap than the first active layer, thereby forming a two-dimensional electron gas layer between the first active layer and the second active layer, depositing on the second active layer a passivation layer comprising at least an electron donating element and nitrogen, and depositing directly on the passivation layer a source contact and a drain contact.

In a method of the preferred embodiments, the steps of depositing the first, second active layers and the passivation layer are performed in the reaction chamber without subjecting the layers to air or environment.

Preferably, a method of the preferred embodiments further comprises, before the step of depositing the source and drain contacts, the steps of: cooling the reaction chamber, and removing the device (or structure) (with its deposited layers) from the reaction chamber.

In a method of the preferred embodiments, the reaction chamber can be a MOVPE or a MBE reaction chamber.

A method according to the preferred embodiments can further comprise the step of forming a gate contact in electrical contact with the second active layer. Said gate contact can be deposited directly on the passivation layer (i.e., with no intermediary layer).

Alternatively, the passivation layer can be etched, in the channel region, in other words between the source and drain contacts. Said source and drain contacts remain directly on the passivation layer. A method of the preferred embodiments can thus further comprise, after the step of depositing the source and drain contacts directly on the passivation layer, and before the step of forming the gate contact, the step of etching, between the source and drain contacts, the passivation layer.

Preferably, in a method of the preferred embodiments, the step of depositing the passivation layer is performed at a temperature of from about 700° C. to about 1300° C.

Said passivation layer can comprise (or consist of) CN, BN, GeN or SiN. Preferably, the passivation layer comprises (or consists of), BN or SiN. And more preferably, the passivation layer comprises (or consists of) SiN.

Preferably, the passivation layer is deposited to obtain a thickness of from about 1 nm to about 30 nm.

Preferably, in a method of the preferred embodiments, the first active layer comprises (or consists of) a group III nitride semiconductor material, more particularly comprises (or consists of) GaN.

Preferably, in a method of the preferred embodiments, the second active layer comprises (or consists of) a group III nitride semiconductor material, more particularly comprises (or consists of) AlGaN or AlGaInN.

A method of the preferred embodiments can further comprise the step of depositing a spacer layer between the first active layer and the second active layer. Said spacer layer aims more particularly at increasing mobility in the two-dimensional electron gas layer. Preferably, the spacer layer comprises (or consists of) AlN.

A method of the preferred embodiments can further comprise the step of depositing a third layer between the second active layer and the passivation layer. Said third layer can be used for doping purposes or for increasing the carrier density in the channel. Preferably, the third layer comprises (or consists of) a group III nitride semiconductor material, more particularly comprises (or consists of) GaN.

A method of the preferred embodiments can further comprise the step of depositing a buffer layer between the substrate and the first active layer. Said buffer layer aims at providing an appropriate crystal structure transition between the substrate and the other layers. Preferably, the buffer layer comprises (or consists of) a group III nitride semiconductor material, and more particularly comprises (or consists of) AlN, GaN, AlGaN, InGaN, and/or AlInGaN, Preferably, in a method of the preferred embodiments, the substrate comprises (or consists of) a material selected from the group consisting of silicon, sapphire, SiC, GaN and AlN.

A method according to the preferred embodiments can be used for fabricating a group III-N field effect device, and more particularly for fabricating a HEMT, MOSHFET, MESFET, MISFET, or MISHFET device.

A semiconductor device obtainable by a method according to the preferred embodiments is also provided.

FIG. 1 shows a HEMT device in accordance with the preferred embodiments. The HEMT device (10) comprises: a substrate (11), a first active layer (12), a second active layer on the first active layer, the second active layer having a higher bandgap than the first active layer (13), a two-dimensional electron gas layer between the first active layer and the second active layer, a passivation layer on the second active layer (14), and a source contact (15) and a drain contact (16), the source contact and the drain contact contacting the passivation layer.

The device can further comprise a gate (17) contact in electrical contact with the second active layer.

In a preferred embodiment, a passivation layer is deposited on the second active layer in-situ, at high temperature, in the MOCVD reactor chamber, prior to cooling down the structure and exposing the top surface to air contamination. The formation of the transistor, in particular the contact deposition, is then performed without any removal of the passivation layer prior to contact deposition, notably for the ohmic contact.

The MOVPE growth of such heterostructures, followed by the preparation of high electron mobility transistors on top of those heterostructures, with the technique suggested, allows for better performance of the transistor: higher current density, higher power performance compared to: (a) transistors prepared without any passivation, (b) transistors prepared with in-situ passivation or ex-situ between the drain and the source, (c) transistors prepared with in-situ passivation and removal of the passivation layer below the ohmic contacts. As an example, it allows for doubling of the current density, compared to a transistor prepared with ex-situ deposition of the passivation layer between the drain and source, which is actually the most widely used technique to develop group III-nitride devices nowadays.

In-situ passivation prevents any contamination of the surface prior to processing such that no oxidation of the surface of the second active layer occurs.

Secondly, as the passivation is deposited in-situ at high temperature, close to growth temperature, prior cooling down, it experiences the same cooling down step as the overall structure. The cooling down from growth temperature is thus different with and without the presence of the passivation layer. The presence of passivation layer allows increasing the Al content in the layer, without any cracking of the wafer. This allows for an increase of the 2DEG concentration.

The growth of those structures and the preparation of transistors with this technique such results in a device with the following characteristics. First, improvement of the quality of ohmic contact formation of the device: lower contact resistance, very linear I-V characteristics, sheet resistances in agreement with material properties obtained by Hall measurement, showing that the total current capabilities which are present within the channel can be extracted through the contacts. Deposition of the passivation layer allows for a better ohmic contact formation, with better control of uniformity over a wafer and reproducibility from one wafer to another, by passivating the surface and offering a better control of the surface states, as well a of the strain in the heterostructure, which is entirely controlled during MOVPE growth. In other words, improvement of ohmic contact uniformity and reproducibility is achieved. Secondly, better performance of the transistors such as a higher current density in DC mode because of passivation of the surface states. Thirdly, reduction of the cracks appearance when cooling down the heterostructure from growth temperature to room temperature because the passivation layer is deposited at high temperatures on top of the second active layer. Therefore, it enables the thickness of the second active layer to be increased. When the second active layer is AlGaN, increasing the thickness allows to increase the Al content in the top layer, and thus to increase the carrier density in the channel. Since the passivation layer is deposited at higher temperatures before cooling down, formation of cracks is reduced resulting in a higher Al content and thus a higher current density.

Figure 2:
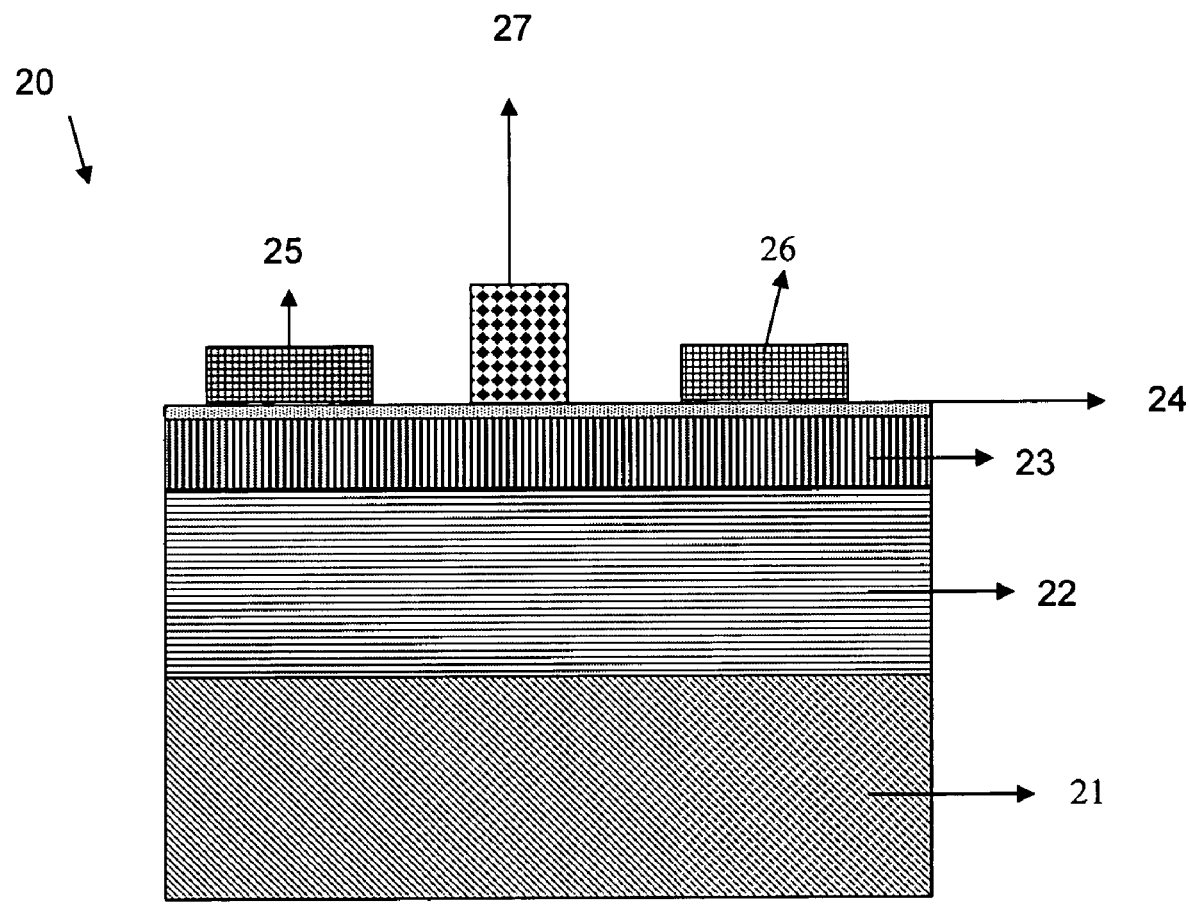
FIG. 2 represents an AlGaN/GaN based HEMT.

FIG. 2 represents an AlGaN/GaN based HEMT (20) in accordance with the preferred embodiments. The HEMT comprises a substrate (21). The substrate can be sapphire, SiC, Si, or GaN.

The substrate can comprise a nucleation layer on the substrate to accommodate the change in crystal parameters between substrate and layer.

A buffer layer can also be included on the substrate to provide for an appropriate crystal structure transition between the substrate and the remainder of the HEMT.

The HEMT (20) comprises a GaN (22) layer on the substrate and an AlGaN (23) layer on the GaN layer such that the GaN layer is sandwiched between the substrate and the AlGaN layer.

The GaN layer is typically from about 1000 to about 3000 nm thick, preferably from about 2000 to about 3000 nm thick while the AlGaN layer is typically from about 10 nm to about 50 nm thick, preferably from about 10 nm to about 40 nm thick.

This top structure can be made of a single AlGaN layer, n-type doped or undoped, or a set of different doped or undoped layers, to increase confinement for the two-dimensional-electron gas.

The Al content can be from about 10% to about 100%.

The GaN layer and the AlGaN layer are typically formed by MOCVD.

The HEMT (20) further comprises a passivation layer (24) on the AlGaN layer. The passivation layer covers the entire AlGaN layer or can partially cover the AlGaN layer. At least the regions where the source contact and the drain contact are formed are preferably covered by the passivation layer.

The passivation layer comprises at least an electron donating element and nitrogen. In particular, the passivation layer can be made of SiN or AlN or a combination including multiple layers of SiN and AlN.

The AlGaN layer has a higher bandgap than the GaN layer.

Between the AlGaN layer and the GaN layer, surface charged layers can be created in the device. The surface charged layers are compensated by the formation of two-dimensional electron gas at the other side of the interface, resulting in high mobility values compared to the bulk material. This is beneficial for the creation of a very high electron mobility channel in the device.

The HEMT further comprises a source contact (25) and a drain contact (26) on the passivation layer. The source contact and the drain contact are made of metals, preferably an alloy of different metals, which are deposited as layers and then annealed. The metals can be selected from the group consisting Ti, Al, Ni, Mo, Ta, Pt, Pd, V, Nb, Zr, and/or Au.

The gate contact (27) is preferably formed of a material selected from the group consisting of Ti, Pt, Cr, Ni, Mo, Co, Au, and Pd, combination thereof and alloys thereof.

During operation of the HEMT, the drain contact is biased at a predetermined potential while the source contact is grounded. Consequently, current flows from the source to the drain in the channel and the 2DEG. The current flow is controlled by the bias and the potential applied to the gate electrode.

The presence of the passivation layer between AlGaN layer and the source contact and the drain contact, respectively, results in an improved device performance.

Figure 3:
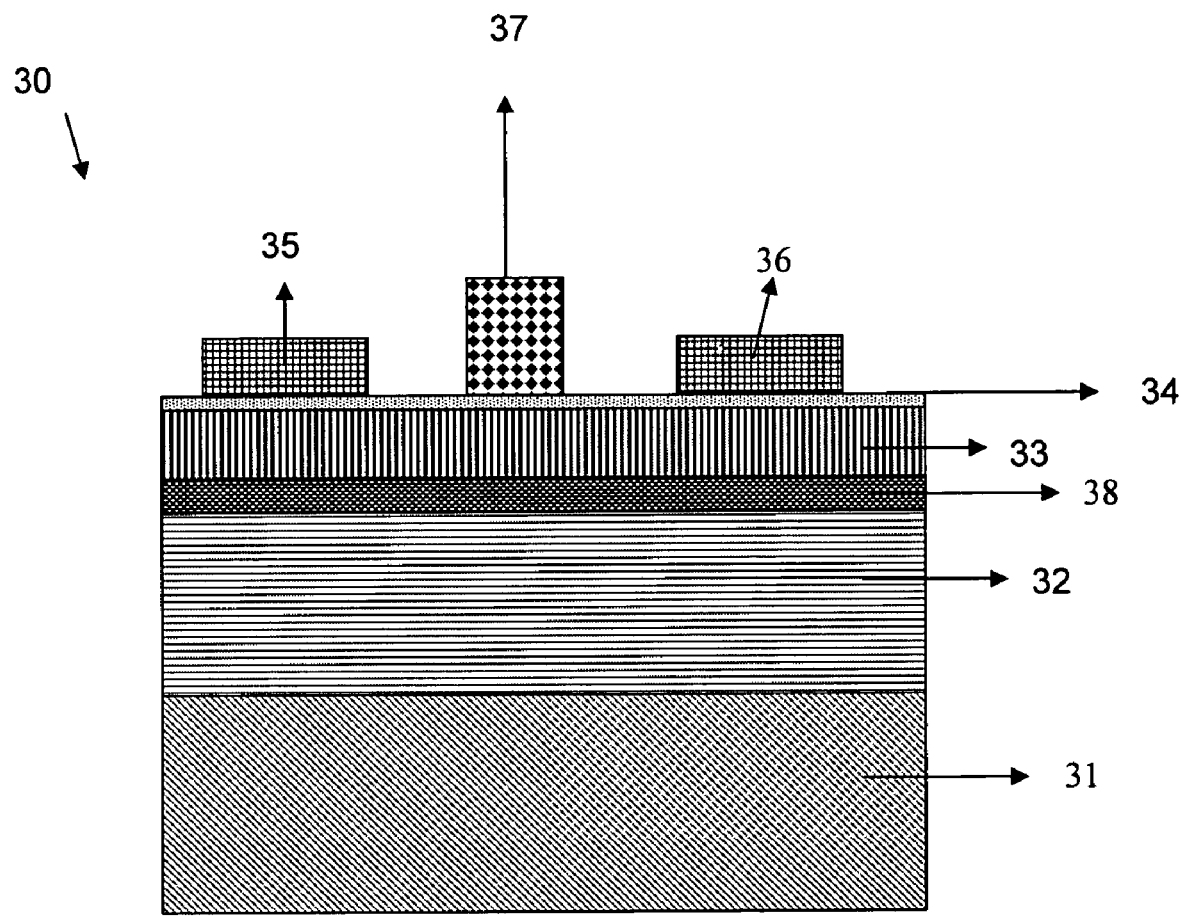
FIG. 3 represents an AlGaN/AlN/GaN based HEMT.

FIG. 3 represents an AlGaN/AlN/GaN based HEMT (30) similar to the HEMT (20) in FIG. 2.

The HEMT has similar layers comprising a substrate (31), an AlGaN layer (32), a GaN layer (33), and a passivation layer (34).

Further, the HEMT comprises a source electrode (35), a drain electrode (36), and a gate electrode (37).

The HEMT (30) further comprises an AlN layer (38) disposed on the AlGaN layer between the AlGaN layer and the GaN layer. The AlN layer enables a higher bandgap to be obtained, thus a more narrow 2DEG channel and less penetration of the wave function in the AlGaN layer, resulting in reduced scattering (reducing the effect of interface roughness), thus increasing the mobility.

Figure 4:
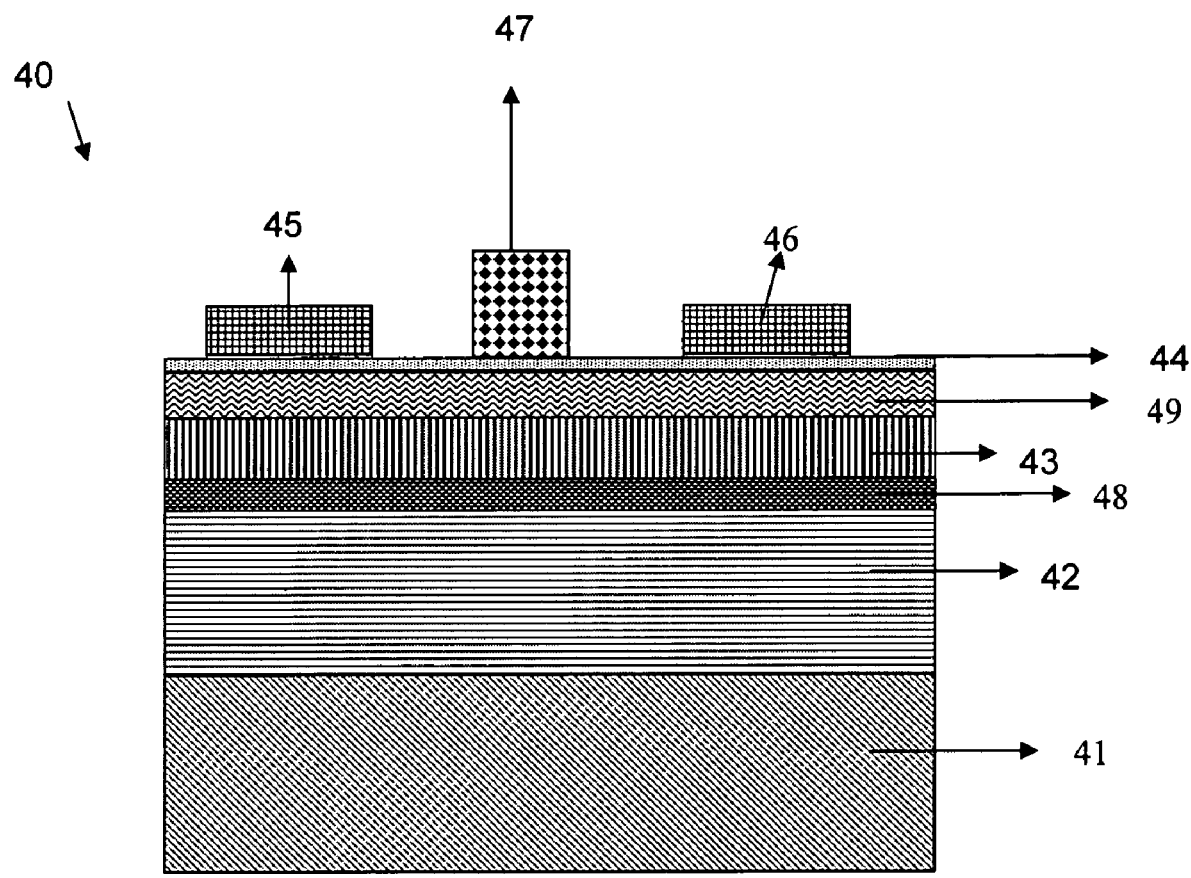
FIG. 4 represents a GaN/AlGaN/AlN/GaN based HEMT.

FIG. 4 represents a GaN/AlGaN/AlN/GaN based HEMT (40) similar to the HEMT (20) in FIG. 2.

The HEMT has similar layers comprising substrate (41), an AlGaN layer (42), a GaN layer (43), and a passivation layer (44).

The HEMT (40) further comprises an AlN layer (48) disposed on the AlGaN layer between the AlGaN layer and the GaN layer.

The HEMT (40) further comprises a GaN layer (49) on top op the AlGaN layer.

The passivation layer is deposited on top of the GaN layer. The GaN layer can prevent oxidation of the AlGaN layer.

Figure 5:
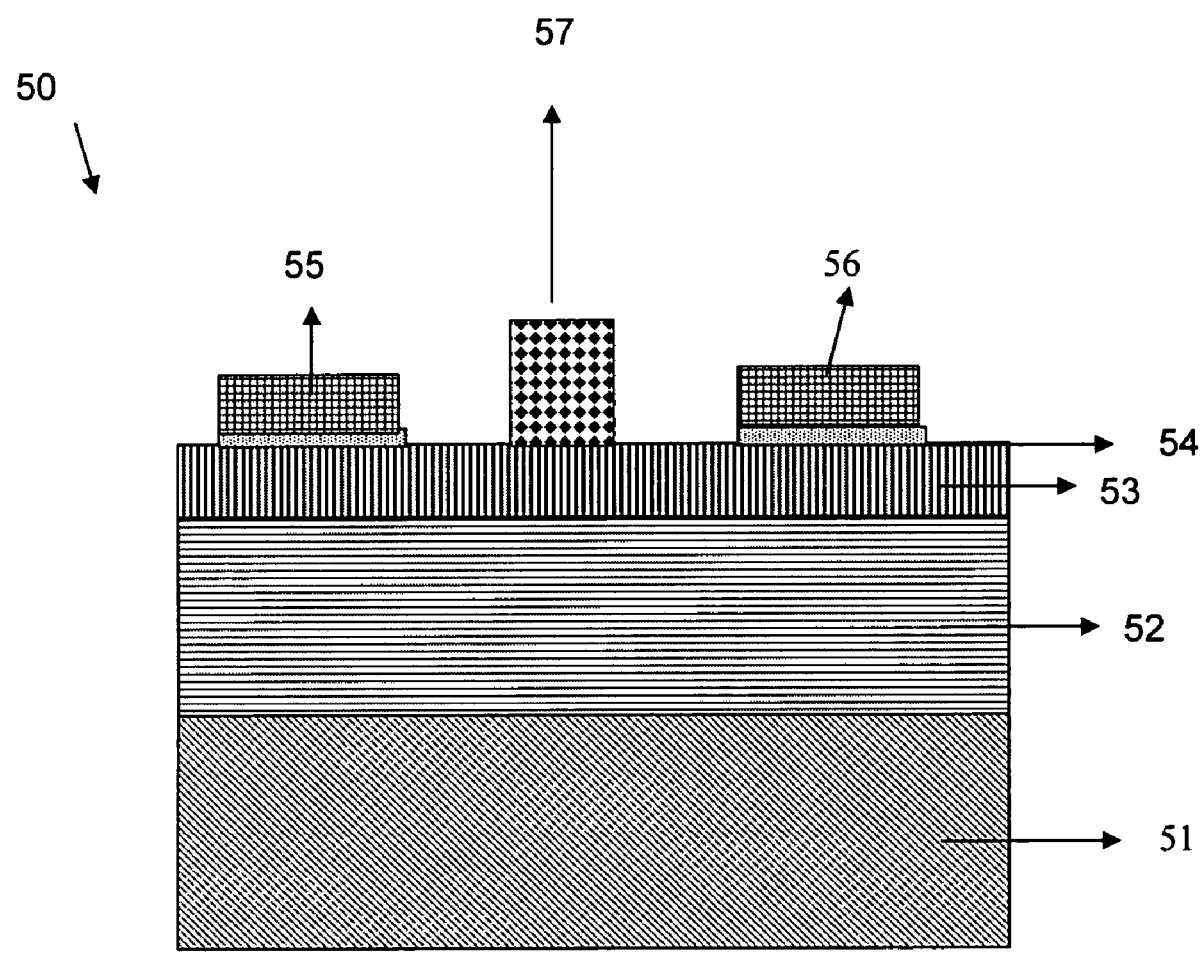
FIG. 5 represents an AlGaN/GaN based HEMT.

FIG. 5 represents an AlGaN/GaN based HEMT (50) similar to the HEMT in FIG. 2.

The HEMT has similar layers comprising a substrate (51), an AlGaN layer (52), and a GaN layer (53).

Further, the HEMT comprises a source electrode (55), a drain electrode (56), and a gate electrode (57).

The gate contact is in direct contact with the AlGaN layer, meaning that no passivation layer (54) is present between the gate contact and the Al GaN layer.

Figure 6:
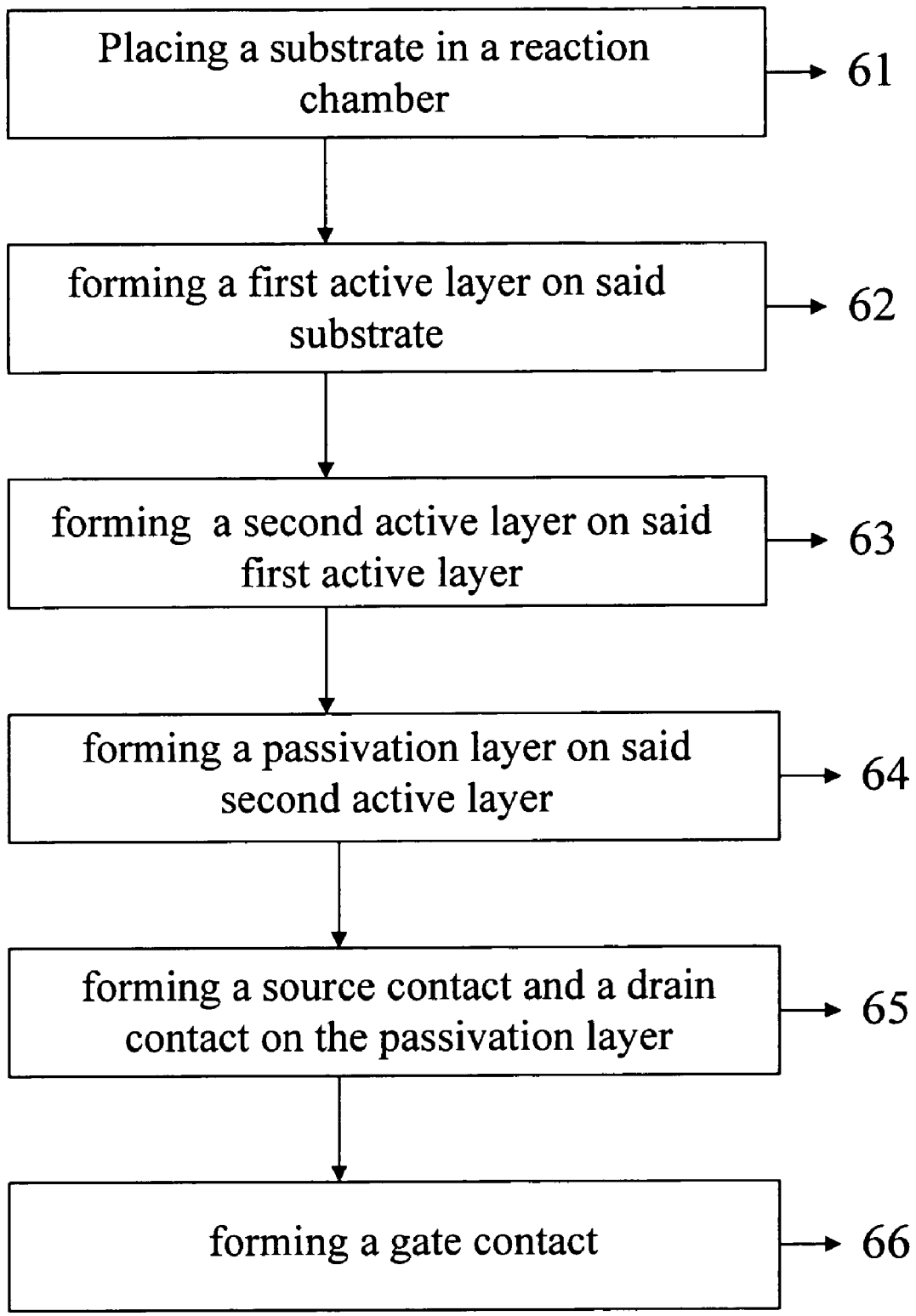
FIG. 6 represents a method for forming a HEMT device.

FIG. 6 shows a method for forming a HEMT device, the method comprising the steps of: placing a substrate in a reaction chamber (61); forming a first active layer on the substrate (62); forming a second active layer on the first active layer, the second active layer having a higher bandgap than the first active layer, thereby forming a two-dimensional electron gas layer between the first active layer and the second active layer (63); forming a passivation layer on the second active layer (64); and forming a source contact and a drain contact, the source contact and the drain contact contacting the passivation layer, with part of the passivation layer being uncovered by the source contact and the drain contact (65).

The method can further comprise the step of forming a gate contact in electrical contact with the second active layer (66). The gate contact is formed on the uncovered part of the passivation layer. This step is optional.

The steps of forming a first active layer, forming a second active layer, and forming a passivation layer are performed in a MOCVD reactor chamber in a continuous process, meaning without subjecting the device to the air ("in-situ" formation). The formation of an oxide on the second active layer is substantially avoided. Moreover, the step of removing the oxide layer from the top surface of the second active layer is avoided. This results in an improved ohmic contact formation. The prior art shows that the oxide which spontaneously forms over the top surface of the second active layer is very stable, and thus requires high power and/or high duration of plasma etching prior to effectively eliminating the oxide layer.

The processing of transistors on such structures consists of: device isolation by plasma etching or by implantation, deposition of the ohmic contact on the SiN layer (no etching). The metal layers are made of combination of different metal layers selected from the group consisting of Ti, Al, Ni, Mo, Ta, Pt, Pd, V, Nb, Zr and Au and alloys thereof, annealing of the ohmic contact, and deposition of a gate contact (e-beam or optical gates). The gate is preferably made of a material selected from the group consisting of Ti, Pt, Cr, Ni, Mo, Co, Au and Pd, combination thereof and alloys thereof. Optionally, deposition of a second passivation step between drain and source (which can be PECVD SiN or $SiO_2$) can be performed. Any other lithography and/or metallization step for alignment purposes or thickening of the metal layers can be conducted before or after any of the preceding steps.

Figure 7:
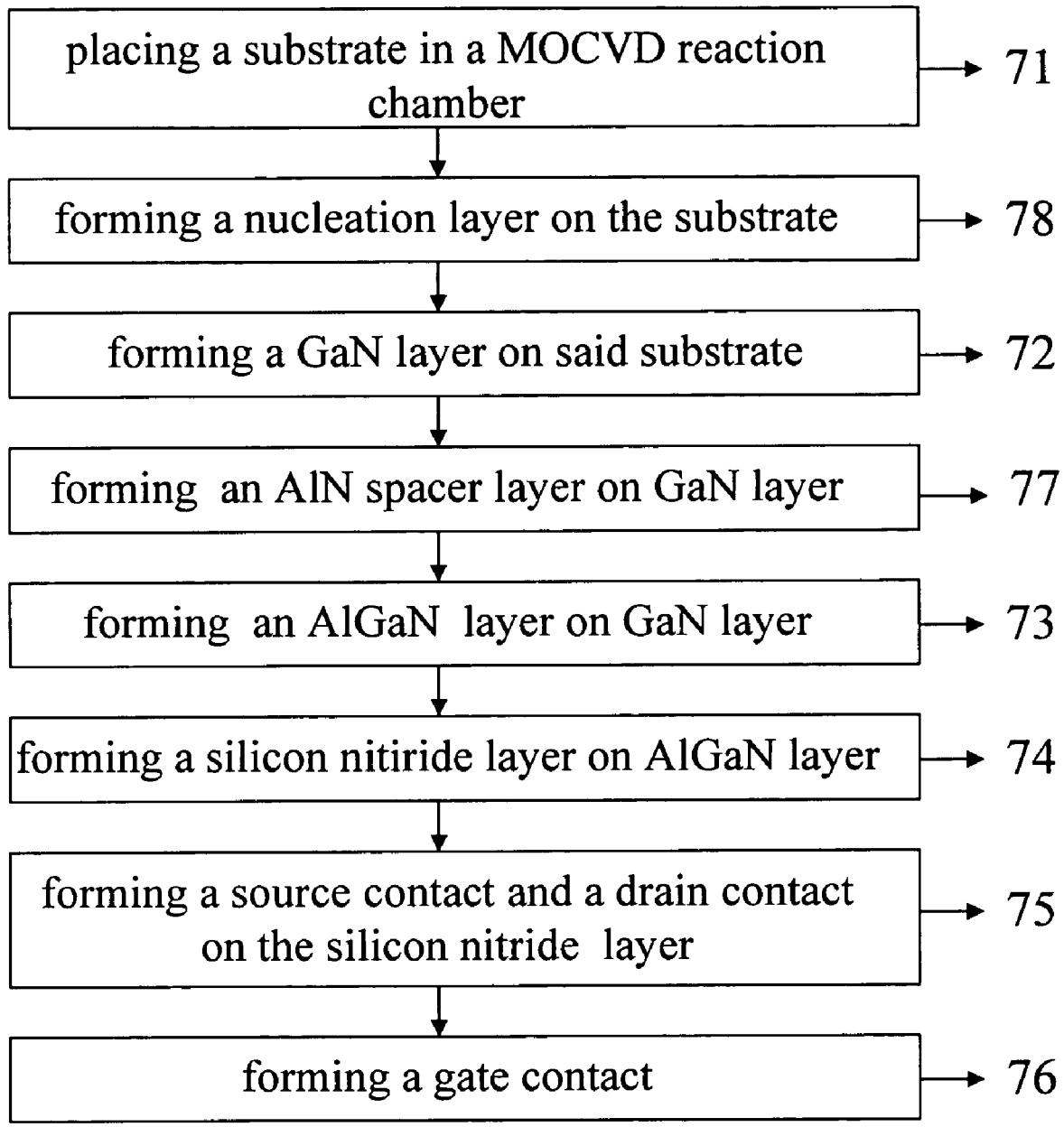
FIG. 7 represents a method for forming an AlGaN/GaN based HEMT device.

FIG. 7 represents a method for forming an AlGaN/GaN HEMT device in accordance with the preferred embodiments.

The AlGaN/GaN structures were grown by Metal-Organic Vapor Phase Epitaxy (MOVPE) on [0001] sapphire substrates. Starting compounds are preferably trimethylgallium (TMGa), trimethylaluminum (TMAl), ammonia ($NH_3$) and silane ($SiH_4$, 200 ppm in hydrogen). The silane introduction line is modified in such a way that the amount of silane introduced in the reactor can be regulated from about 5 nmol/min up to about 1 µmol/min.

As first step (71) in the growth process, the substrates are annealed in $H_2$ at about 1050° C. at about 53.33 mbar (40 torr). Then, nitridation of the surface is carried out at about 800° C. by introducing $NH_3$ into the reactor. After that, the substrates are cooled down to about 525° C. and a thin nucleation layer is grown (78) at about 533.3 mbar (400 torr) by introducing TMGa into the reactor for about 120 seconds. Subsequently, the temperature is ramped to about 1020° C. and at a pressure of about 133.3 mbar (100 torr) GaN is grown to a thickness of about 2.6 microns (72). Then, the growth is interrupted after about 30 seconds while the reactor pressure is decreased to about 53.33 mbar (40 torr). During about 7-10 seconds, an AlN spacer layer (77) is grown, followed by an $Al_xGa_{1-x}N$ layer (73) of a thickness of from about 20 to about 22 nm.

After the last group III-N layer is grown at low pressure (below about 266.6 mbar (200 torr)) and at high temperatures (typically from about 950° C. to about 1200° C.), the group III compound source is stopped, while keeping the $NH_3$ flow to the reactor and opening the $SiH_4$ line, allowing for growth of SiN at high temperature (74) After growth of a thin SiN layer (from about 1 nm to about 30 nm), the $SiH_4$ flow is stopped and the structure is cooled down to room temperature while keeping the $NH_3$ flow, to avoid desorption from the top layer. After cooling down the structure, the wafers are unloaded out of the reactor. The surface is very well protected by the SiN passivation layer.

The processing of transistors (steps 75 and 76) on such structures is similar to the process described above.

EXAMPLES

Example 1

AlGaN/GaN HEMT structures were grown at low pressure (133.3 mbar (100 Torr)) using Metal Organic Vapor Phase Epitaxy (MOVPE). As starting compounds, trimethyl gallium (TMGa), trimethyl aluminum (TMAl) and ammonia ($NH_3$) were used.

The metal-organic precursors were transported with hydrogen as carrier gas; the amounts were regulated by means of mass flow controllers and the temperature of the thermostat baths in which the metal organic bubblers are mounted.

The flow of ammonia was also regulated by means of a mass flow controller and traces of water and oxygen were removed by an in-line filter.

Additionally, n-type doping of the GaN and (Al,Ga)N layers was achieved by adding silane ($SiH_4$) during growth.

All gasses were introduced into the reactor via the so-called close-coupled showerhead.

After degassing the substrate at high temperatures (about 1100° C.), a thin GaN buffer layer was deposited at lower temperature using $NH_3$ and TMGa.

The substrate temperature was then set to about 1020° C. and an approximately 2 micrometer thick semi-insulating GaN layer was grown.

After 2 micrometer of growth, the pressure was lowered to 53.33 mbar (40 T), the temperature was raised to 1050° C. and Al flow was sent to the reactor for deposition of $Al_xGa_{1-x}N$, with x from about 20% to about 40%. The typical thickness of AlGaN was 25 nm. The sources for III-type elements were then sent to the vent and $SiH_4$ was introduced in the reactor, simultaneously with $NH_3$, at the same pressure and temperature conditions as for AlGaN growth. The SiN grew from $NH_3$ and $SiH_4$ at a growth rate of about 6 nm/h. The SiN layer can also be grown at a growth rate of 0.3 µ/h.

Transistors were then prepared on these structures using standard processing, without any etching of the top SiN layer. Transfer Length method showed a reduction of the ohmic contact resistance but also a large improvement of the I-V characteristic uniformity, giving sheet resistivity values in fair agreement with Hall measurements. Spectacular improvement of the DC characteristics was observed: drain-source current measurements for a positively biased gate (2V) showed an increase of more than a factor two in current density from 0.5 A/mm in the reference sample to 1.2 A/mm with in-situ passivation, for a device width of 100 µm and a gate length of 0.2 µm. RF measurements showed a $f_t$ of 40 GHZ and $f_{max}$ of 80 GHz, for the same device geometry. This was an increase in current density compared to results obtained with ex-situ SiN passivation. Further, an improvement of DC and RF properties was observed.

Example 2

AlGaN/GaN HEMT structures were grown by MOVPE on [0001] sapphire substrates. A Thomas Swan close-coupled showerhead reactor was used with starting compounds trimethylgallium (TMGa), trimethylaluminum (TMAl), ammonia (NH$_3$), and diluted silane (SiH$_4$, 200 ppm in hydrogen). The silane introduction line was modified in such a way that the amount of silane introduced in the reactor was regulated from the required amount for n-type doping of GaN (a few nmol/min up) to about 1 µmol/min.

After deposition of a thin GaN nucleation layer at low temperature, a 2.6 µm thick GaN layer was grown at 1020° C. with a reactor pressure of 133.3 mbar (100 Torr). Prior to deposition of the AlGaN, a thin AlN spacer layer was grown at 53.33 mbar (40 Torr) to improve mobility in the 2DEG. Depending on samples, the top AlGaN layer was from 22 to 24 nm thick and the Al content was 30% as determined by High-Resolution X-Ray Diffraction measurements. After growth of the AlGaN layer, the reactor was purged for 10 seconds while maintaining the NH$_3$ flow, then silane was introduced. SiN thicknesses of from 3.5 to 15 nm were observed.

Transistors were processed on these heterostructures. For the sake of comparison, similar structures without the in-situ grown SiN protecting layer have also been processed using the same technology, simultaneously. After mesa isolation by Cl$_2$-based plasma etching, Ti/Al/Pt/Au contacts were deposited on the SiN top layer, without any etching of the passivating layer and followed by rapid thermal annealing. Electron-beam lithography was used to pattern the gate Ni/Au Schottky contacts, to a dimension of 0.2 µm. A second Si$_3$N$_4$ passivating layer, now deposited by PECVD, protected the transistor.

Figure 8:
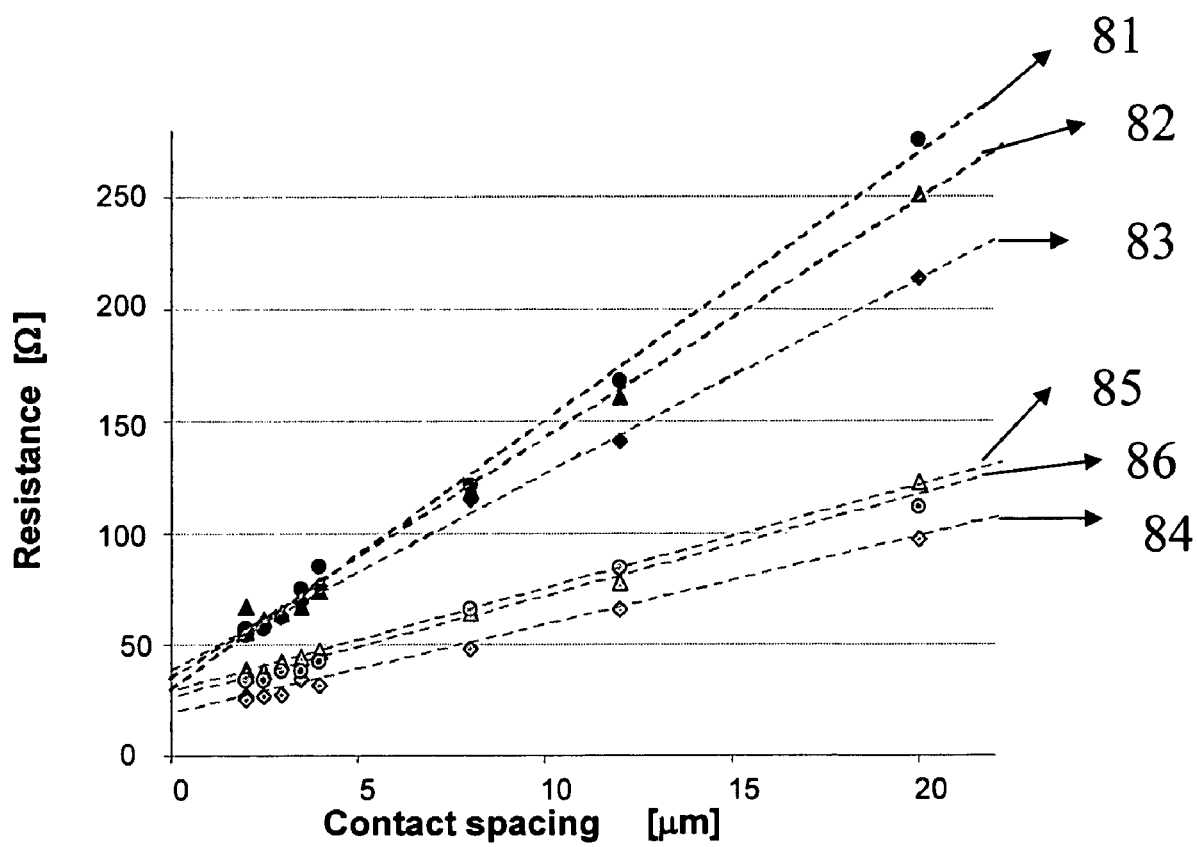
FIG. 8 represents Transfer Length Measurements for uncapped and capped HEMT structures at three different temperatures.

To assess the ohmic contact quality on the SiN capped heterostructures, Transfer Length Method (TLM) were performed and are shown in FIG. 8, for three different annealing temperatures.

The TLM measurements performed on uncapped HEMT structure (without SiN passivation layer) (81 at 820° C., 82 at 860° C., 83 at 900° C.) gave a best ohmic contact resistance of 1.49 Ωmm. However, for the three different annealing temperatures, the slope of the TLM line, which gives the sheet resistance, was different and varied between 395 and 528 Ω/sq. These values were moreover higher than the sheet resistance value determined by Hall or by contact-less sheet resistivity measurements (Ω/sq). In contrast, TLM measurements performed on the capped SiN epiwafers (with SiN passivation layers) (84 at 820° C., 85 at 860° C., 86 at 900° C.) displayed a single sheet resistance value, in fair agreement with the other determinations of the sheet resistance values. Moreover, the ohmic contact resistance reduced to a value of 0.88 Ωmm, for a similar ohmic contact deposition scheme.

Figure 9A:
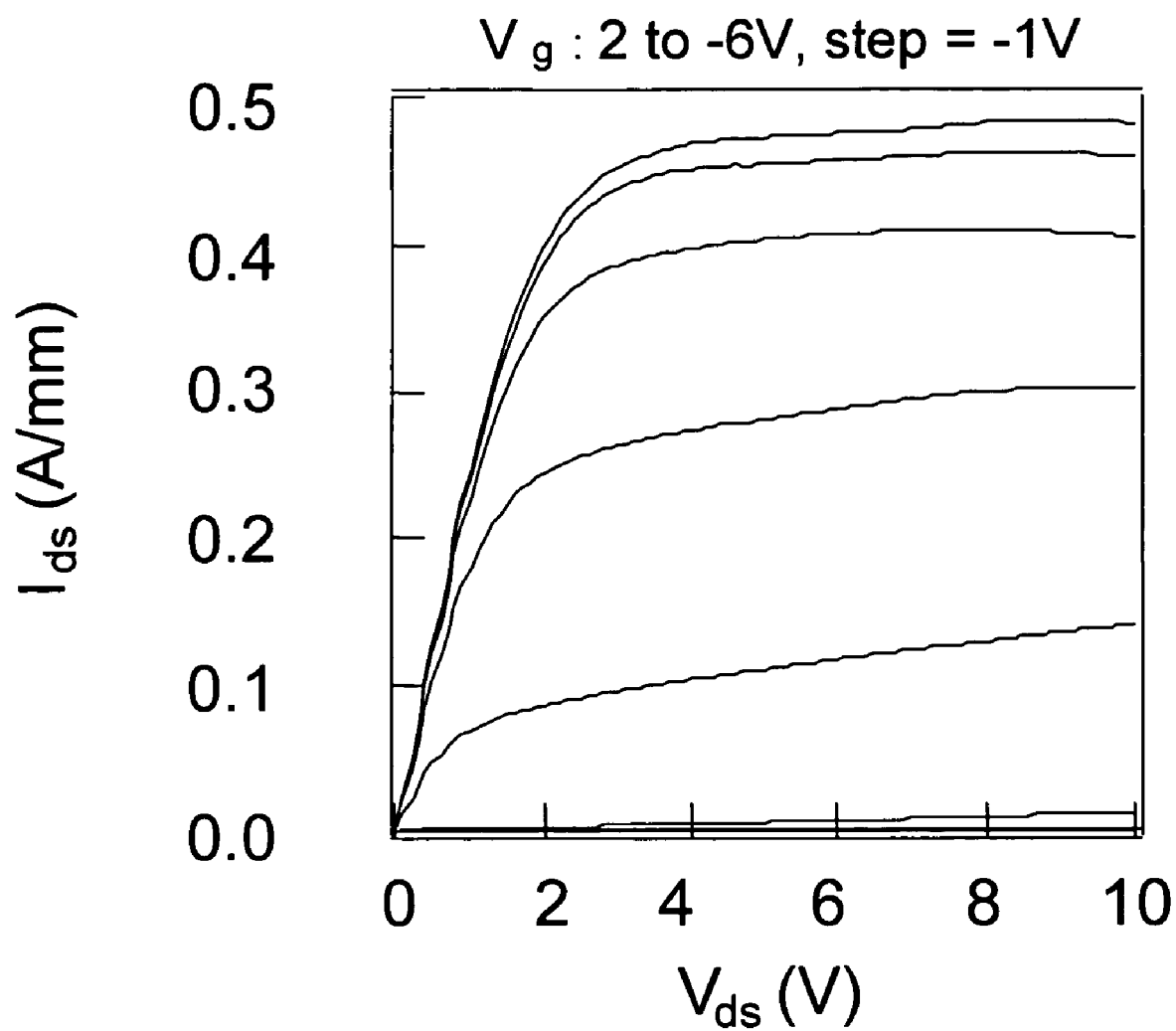
FIGS. 9*a* and 9*b* represent DC drain source current-voltage characteristics for different gate bias voltages.
Figure 9B:
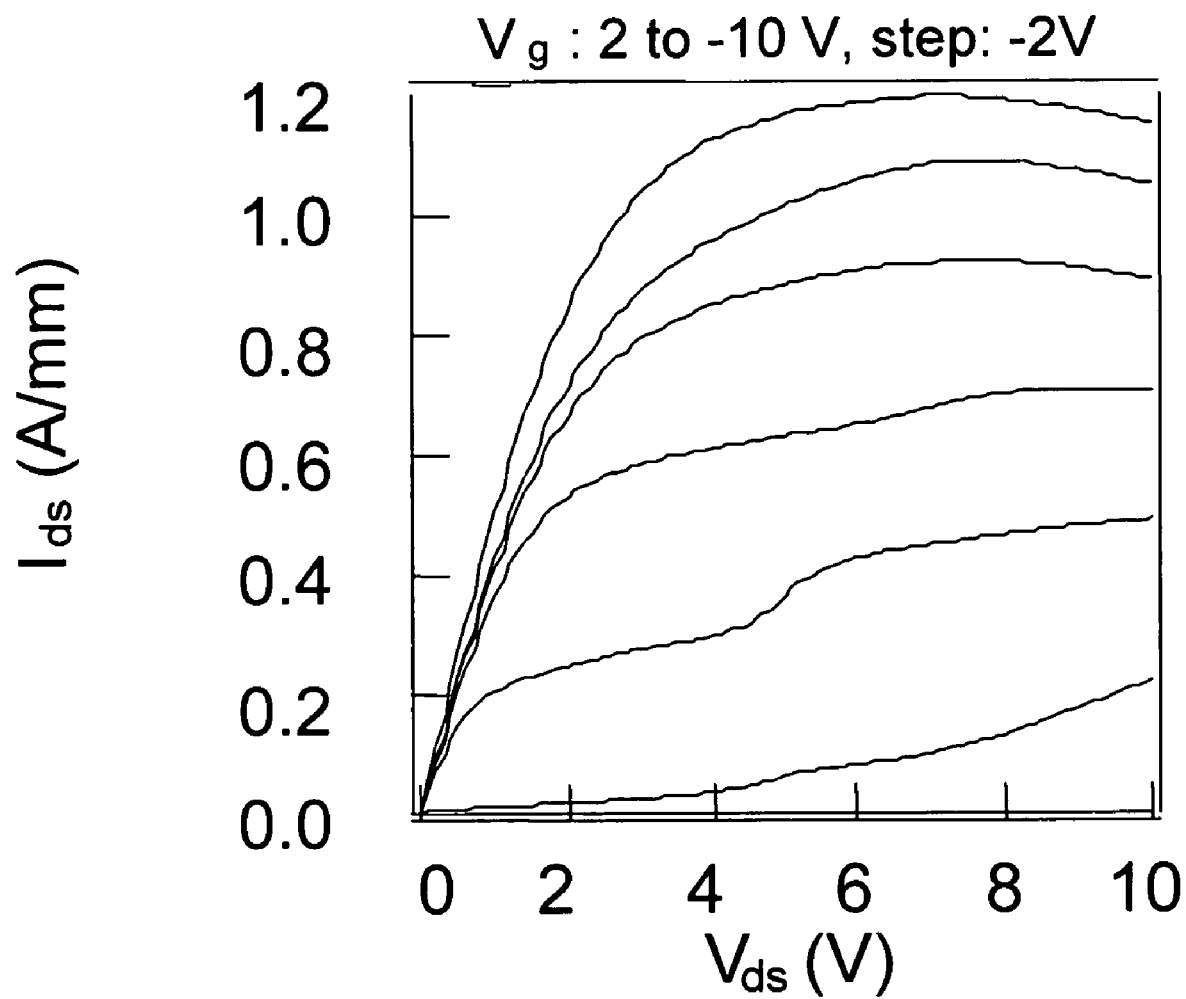

The DC drain source current-voltage characteristics for different gate bias voltages are given in FIG. 9, for a device width of 100 µm and gate length of 0.2 µm; similar HEMT structure were processed, one having no SiN passivation layer (also referred to as "uncapped") (a) and the other HEMT having a SiN passivation layer between the ohmic contacts and the AlGaN layer (also referred to as "capped in-situ"), the passivation layer being a 7 nm thick SiN layer (b). For a gate bias voltage of 2 V, the measurements showed an improvement of more than a factor two in current density from 0.5 A/mm to 1.2 A/mm.

Small-signal RF measurements were also performed on the transistors. Without an in-situ SiN layer, $f_t$ and $f_{max}$ were respectively 24 GHz and 68 GHz, whereas for the in-situ passivated one, they gave a $f_t$ of 40 GHz and $f_{max}$ of 80 GHz.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modification will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodiment in the attached claims.

What is claimed is:

1. A semiconductor device comprising:
   a substrate;
   a first active layer;
   a second active layer on the first active layer, the second active layer having a higher bandgap than the first active layer;
   a two-dimensional electron gas layer between the first active layer and the second active layer;
   a passivation layer comprising an electron donating element and nitrogen, wherein the passivation layer is on the second active layer; and
   a source contact and a drain contact directly on the passivation layer.

2. The semiconductor device according to claim 1, wherein the passivation layer comprises SiN.

3. The semiconductor device according to claim 1, wherein the passivation layer comprises BN.

4. The semiconductor device according to claim 1, wherein the first active layer comprises a group III nitride semiconductor material.

5. The semiconductor device according to claim 4, wherein the first active layer comprises GaN.

6. The semiconductor device according to claim 1, wherein the second active layer comprises a group III nitride semiconductor material.

7. The semiconductor device according to claim 6, wherein the second active layer is selected from the group consisting of AlGaN, AlInN, and AlInGaN.

8. The semiconductor device according to claim 1, further comprising a gate contact in electrical contact with the second active layer.

9. The semiconductor device according to claim 1, further comprising a spacer layer between the first active layer and the second active layer.

10. The semiconductor device according to claim 9, wherein the spacer layer comprises AlN.

11. The semiconductor device according to claim 1, further comprising a layer between the second active layer and the passivation layer.

12. The semiconductor device according to claim 11, wherein the layer between the second active layer and the passivation layer comprises a group III nitride material.

13. The semiconductor device according to claim 1, wherein the passivation layer has a thickness of from about 1 nm to about 30 nm.

14. The semiconductor device according to claim 1, wherein the substrate comprises a material selected from the group consisting of silicon, sapphire, SIC, GaN, and AlN.

* * * * *

UNITED STATES PATENT AND TRADEMARK OFFICE
CERTIFICATE OF CORRECTION

PATENT NO.         : 7,547,928 B2
APPLICATION NO.    : 11/174343
DATED              : June 16, 2009
INVENTOR(S)        : Germain et al.

It is certified that error appears in the above-identified patent and that said Letters Patent is hereby corrected as shown below:

| Issued Patent | | Description of Error |
| --- | --- | --- |
| Column | Line | |
| Page 1 (Item 57) Abstract | 4 | Change "Expitaxy," to --Epitaxy,--. |
| Sheet 7 of 10 (Reference Numeral 74) (Figure 7) | 1 | Change "nitiride" to --nitride--. |
| 2 | 48 | Change "piezeoelectric" to --piezoelectric--. |
| 3 | 15 | After "performance" insert --.--. |
| 10 | 29 | Change "AlInGan," to --AlInGaN.--. |
| 16 | 37-38 | Change "modification" to --modifications--. |
| 16 | 44 | Change "embodiment" to --embodied--. |
| 18 | 12 | In Claim 14, change "SIC," to --SiC,--. |

Signed and Sealed this

Fifteenth Day of December, 2009

David J. Kappos
*Director of the United States Patent and Trademark Office*